(12) United States Patent
Clark et al.

(10) Patent No.: US 9,685,352 B2
(45) Date of Patent: Jun. 20, 2017

(54) APPARATUS FOR CONSERVING ELECTRONIC DEVICE MANUFACTURING RESOURCES INCLUDING OZONE

(71) Applicant: Applied Materials, Inc., Santa Clara, CA (US)

(72) Inventors: Daniel O. Clark, Pleasanton, CA (US); Phil Chandler, San Francisco, CA (US); Jay J. Jung, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 86 days.

(21) Appl. No.: 14/610,301

(22) Filed: Jan. 30, 2015

(65) Prior Publication Data

US 2015/0136239 A1     May 21, 2015

Related U.S. Application Data

(62) Division of application No. 12/410,435, filed on Mar. 24, 2009, now Pat. No. 8,974,605.
(Continued)

(51) Int. Cl.
    *H01L 21/67*     (2006.01)
    *C23C 14/56*     (2006.01)
    (Continued)

(52) U.S. Cl.
    CPC ........ *H01L 21/67017* (2013.01); *B01D 53/38* (2013.01); *B01D 53/74* (2013.01);
    (Continued)

(58) Field of Classification Search
    CPC ..... C23C 16/44; C23C 16/52; C23C 16/4408; C23C 16/4412; C23C 16/4481; C23C 16/455; C23C 14/56; H01L 21/00; H01L 21/205; H01L 21/66; H01L 21/67011; H01L 21/67017; B01D 53/38; B01D 53/46; B01D 53/74
    See application file for complete search history.

(56) References Cited

U.S. PATENT DOCUMENTS

| | | |
|---|---|---|
| 5,913,721 A | 6/1999 | Teng |
| 6,197,123 B1 | 3/2001 | Poag et al. |
| | (Continued) | |

FOREIGN PATENT DOCUMENTS

| | | |
|---|---|---|
| KR | 1019980005394 | 3/1998 |
| KR | 20000022566 A | 4/2000 |
| | (Continued) | |

OTHER PUBLICATIONS

International Search Report and Written Opinion of International Application No. PCT/US2009/038144 mailed Oct. 30, 2009.
(Continued)

*Primary Examiner* — Saeed T Chaudhry
(74) *Attorney, Agent, or Firm* — Dugan & Dugan, P.C.

(57) ABSTRACT

An electronic device manufacturing system is provided that may reduce the amount of resources used in electronic device manufacturing processes. In some embodiments, unreacted ozone exiting a process tool operating in an ozone mode may be diverted and used as an oxidant in an abatement tool when the process tool is operating in a non-ozone mode. Numerous other embodiments are provided.

20 Claims, 11 Drawing Sheets

Related U.S. Application Data

(60) Provisional application No. 61/039,415, filed on Mar. 25, 2008.

(51) Int. Cl.
  B01D 53/74 (2006.01)
  C23C 16/44 (2006.01)
  B01D 53/38 (2006.01)

(52) U.S. Cl.
  CPC .......... C23C 14/56 (2013.01); C23C 16/4412 (2013.01); *Y10T 137/0318* (2015.04); *Y10T 137/0419* (2015.04)

(56) References Cited

U.S. PATENT DOCUMENTS

| | | |
|---|---|---|
| 6,322,756 B1 | 11/2001 | Arno et al. |
| 6,423,284 B1 | 7/2002 | Arno et al. |
| 2004/0020599 A1 | 2/2004 | Tanaka |
| 2004/0058488 A1 | 3/2004 | Arno |
| 2004/0159235 A1 | 8/2004 | Marganski et al. |
| 2005/0109369 A1 | 5/2005 | Reder et al. |
| 2007/0079849 A1 | 4/2007 | Hogle et al. |
| 2007/0299274 A1* | 12/2007 | Meiere .................... C07F 7/025 556/407 |
| 2009/0017206 A1* | 1/2009 | Clark ................. C23C 16/45593 427/248.1 |
| 2009/0216061 A1* | 8/2009 | Clark ................... B01D 53/005 588/313 |
| 2009/0246105 A1 | 10/2009 | Clark et al. |

FOREIGN PATENT DOCUMENTS

| | | |
|---|---|---|
| KR | 20010030153 A | 4/2001 |
| KR | 1020070108544 | 11/2007 |

OTHER PUBLICATIONS

International Preliminary Report on Patentability of International Application No. PCT/US2009/038144 mailed Oct. 7, 2010.
Restriction Requirement of U.S. Appl. No. 12/410,435, mailed Jan. 19, 2012.
Feb. 6, 2012 Response to Restriction Requirement of U.S. Appl. No. 12/410,435, mailed Jan. 19, 2012.
Non-Final Office Action of U.S. Appl. No. 12/410,435, mailed Mar. 13, 2012.
May 17, 2012 Reply to Non-Final Office Action of U.S. Appl. No. 12/410,435, mailed Mar. 13, 2012.
Final Office Action of U.S. Appl. No. 12/410,435 mailed Jul. 31, 2012.
Sep. 21, 2012 Response to Final Office Action of U.S. Appl. No. 12/410,435 mailed Jul. 31, 2012.
Advisory Action of U.S. Appl. No. 12/410,435 mailed Oct. 9, 2012.
Non-Final Office Action of U.S. Appl. No. 12/410,435 mailed May 23, 2013.
Aug. 19, 2013 Reply to May 23, 2013 Non-Final Office Action of U.S. Appl. No. 12/410,435.
Final Office Action of U.S. Appl. No. 12/410,435 mailed Dec. 5, 2013.
Jan. 30, 2014 Reply to Dec. 5, 2013 Final Office Action of U.S. Appl. No. 12/410,435.
Advisory Action of U.S. Appl. No. 12/410,435 mailed Feb. 12, 2014.
Taiwan Search Report of Taiwan Patent Application No. 98109755 dated Jan. 22, 2014.
Notice of Allowance of U.S. Appl. No. 12/410,435 mailed Nov. 5, 2014.
Notice of Allowance of Korean Application No. 10-2016-7003331 dated Oct. 20, 2016.

* cited by examiner

APPARATUS FOR CONSERVING ELECTRONIC DEVICE MANUFACTURING RESOURCES INCLUDING OZONE

CROSS-REFERENCE TO RELATED APPLICATIONS

This is a division of U.S. patent application Ser. No. 12/410,435, filed Mar. 24, 2009, titled "METHODS AND APPARATUS FOR CONSERVING ELECTRONIC DEVICE MANUFACTURING RESOURCES," now U.S. Pat. No. 8,974,605, which claims priority to U.S. Provisional Patent Application No. 61/039,415, filed Mar. 25, 2008, and titled "APPARATUS AND METHODS FOR REDUCING ENERGY USE IN ELECTRONIC DEVICE MANUFACTURING," both of which are hereby incorporated by reference herein in their entireties for all purposes.

FIELD

The present invention relates generally to electronic device manufacturing and is more particularly directed to reducing the amount of resources which are used in electronic device manufacturing processes.

BACKGROUND

Some electronic device manufacturing processes may use large quantities of reagents and/or other materials, and some of these reagents may be harmful and/or hazardous if released to the atmosphere. It is known to abate harmful or otherwise hazardous regions and reagent byproducts through the use of abatement systems which convert the reagents or their byproducts into less harmful and/or less hazardous compounds. While the abatement of these reagents and their byproducts may address the issue of the harmful and/or hazardous nature of the reagents/byproducts, it does not address the fact that a significant quantity of expensive reagents may eventually be wasted when the reagents pass unused through a process chamber.

Other materials, which although they may not be harmful or hazardous, still represent a large cost for electronic device manufacturing systems.

It is desirable therefore to develop methods and apparatus which would reduce the amount of reagents and/or other materials which are required to be produced and/or purchased for use in electronic device manufacturing processes.

SUMMARY

In one aspect, a method for operating an electronic device manufacturing system is provided, including the steps: introducing an inert gas into a process tool vacuum pump at a first flow rate while the process tool is operating in a process mode; and introducing the inert gas into the process tool vacuum pump at a second flow rate while the process tool is operating in a clean mode.

In another aspect, a method of operating an electronic device manufacturing system is provided, including the steps: introducing an inert gas into an inlet of an abatement tool at a first flow rate when a process tool for which the abatement tool abates effluent is operating in a process mode; and introducing the inert gas into the inlet of the abatement tool at a second flow rate when the process tool is operating in a clean mode.

In another aspect, a method of operating an electronic device manufacturing system is provided, including the steps: directing effluent ozone from an electronic device manufacturing tool into an abatement tool for use as an oxidant.

In another aspect, an electronic device manufacturing system is provided, including: a process tool; an ozone supply adapted to supply ozone to the process tool; an abatement unit adapted to receive effluent from the process tool; and a conduit connecting the abatement unit to the process tool which conduit is adapted to direct ozone which exits the process tool into the abatement unit as an oxidant.

Other features and aspects of the present invention will become more fully apparent from the following detailed description, the appended claims and the accompanying drawings.

DETAILED DESCRIPTION

Figure 1:
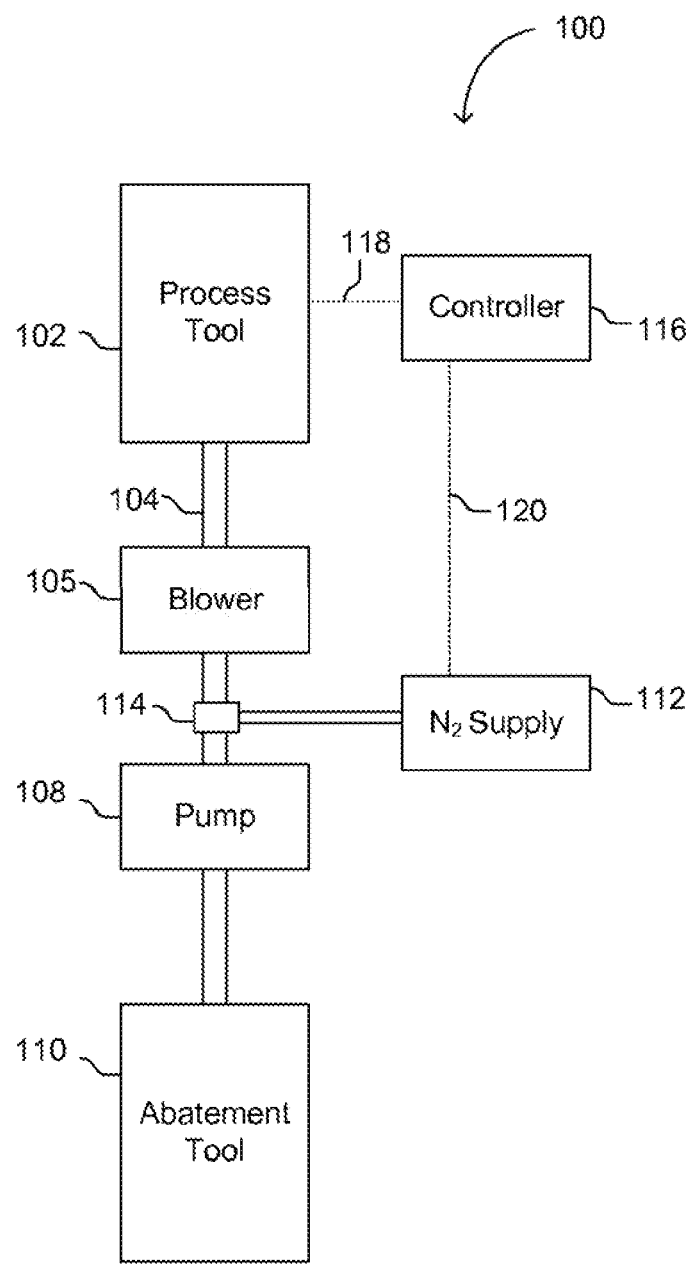
FIG. 1 is a schematic depiction of a system for reducing the use of inert gas to facilitate pumping of effluent and to protect a vacuum pump.

Electronic device manufacturing processes may use large amounts of inert gases, such as nitrogen. Nitrogen, although perhaps not as expensive as some reagents used in electronic device manufacturing, is typically used in volumes large enough to represent a significant cost for an electronic device manufacturing facility.

For example, prior to the present invention, nitrogen has typically been supplied to vacuum pumps for the purpose of facilitating the pumping of hydrogen which, due to its size, may be difficult pump. Supplying nitrogen to the vacuum pumps may increase the viscosity of the gas to be pumped, thereby reducing the pump effort required to pump the gas and thereby reducing the amount of heat which may be imparted to the gas being pumped. In addition, the nitrogen, which may have been boiled off from a container of liquid nitrogen, may typically be at ambient temperature or lower and thus may serve to cool the vacuum pumps. Another reason for flowing nitrogen into the vacuum pumps may be that the nitrogen dilutes cleaning chemistry which may be passing through the pumps and therefore may reduce the detrimental effect of cleaning chemistry on the pump parts and lubricants.

Methods of the present invention reduce the amount of nitrogen which is required to operate electronic device manufacturing facility by tuning the amount of nitrogen supplied to vacuum pumps depending upon whether a process is being performed in a process tool, and if so, the nature of the process, such as, for example, substrate processing or chamber cleaning.

Nitrogen may also be used to protect reaction chamber walls in abatement tools from becoming coated with particulate matter. Thus, nitrogen may be introduced into an abatement tool inlet through which effluent to be abated enters the abatement tool. The inlet may be designed to inject the nitrogen into the abatement tool in the form of an annular sheath around the effluent to be abated. This may have the beneficial effect of preventing oxidation of the effluent until the effluent has traveled further into the abatement tool and may form a protective zone of inert gas proximate to the walls of the reaction chamber through which particulate matter may have difficulty penetrating.

Methods of the present invention reduce the amount of nitrogen which is required to operate the abatement tool by tuning the amount of nitrogen supplied to the abatement tool depending upon whether a process is being performed in the process tool, and if so, the nature of the process. For example, when a cleaning cycle is being performed, we have found that it is beneficial to stop supplying nitrogen to the abatement tool inlet, and that a beneficial cleaning effect may occur in the abatement tool.

In another example prior to the present invention, ozone, which may be used as a reagent in some electronic device manufacturing processes, such as, for example, atmospheric chemical vapor deposition, and the production of organic light emitting diodes, may typically be separately abated. This may require the cost of purchasing and operating additional abatement equipment.

By using additional methods and apparatus of the present invention, the need for abating ozone may be obviated by using the ozone which exits a process chamber as an oxidant in an abatement tool. This has the added benefit of reducing the amount of oxidant which may need to be purchased or otherwise supplied to the abatement tool.

FIG. 1 is a schematic drawing of a system 100 of the present invention for reducing the use of inert gas. System 100 may include any electronic device manufacturing process tool 102. Process tool 102 may be a CVD chamber, a PVD chamber, an epitaxial chamber, or any other electronic device manufacturing process tool which produces an effluent byproduct which requires abatement. Process tool 102 may be connected by a conduit 104 to a blower 105, a mechanical pump 108, and an abatement tool 110. The system 100 may also include a nitrogen supply 112 which may be adapted to introduce nitrogen into an effluent stream flowing through conduit 104 at mixing junction 114. Mixing junction 114 may be a T. junction or any other suitable junction. As described above, the introduction of nitrogen into the effluent stream flowing through conduit 104 facilitates the pumping of smaller molecules such as hydrogen by the mechanical pump 108. The nitrogen, which may be at ambient temperature or below, may also serve to help reduce the temperature of the pump 108 and the effluent flowing through the pump 108. The system 100 may also include controller 116 which may be connected to the process tool 102, through signal line 118 and to the nitrogen supply 112 through signal line 120. Controller 116 may be a computer or any logic device such as a PLC, etc.

In operation, process tool 102 may typically be in one of several operating modes. For example, process tool 102 may be in a process mode, where it may be performing a manufacturing step on an electronic device or substrate, or in a clean mode where process chambers (not shown) of the process tool 102 may be cleaned. In both of these modes, the process tool 102 may produce effluent which requires abatement. The process tool 102 may also be in an off mode, such as, for example, when maintenance needs to be performed on the process tool.

When the process tool 102 is in a process mode or in a clean mode, effluent may typically flow out of the process tool 102 through conduit 104. The blower 105, which may be a roots type blower, for example, may create a vacuum which moves effluent from the process tool 102 through conduit 104 to pump 108. The pump 108 may be a mechanical pump or a set of staged mechanical pumps. The pump 108 may cause the effluent contained in conduit 104 to move into the abatement tool 110 where the effluent may be abated.

As discussed above, nitrogen may be introduced into the effluent stream in conduit 104 from nitrogen supply 112 through mixing junction 114. According to the present invention, the amount of nitrogen which may be supplied from the nitrogen supply 112 into the conduit 104, may then beneficially be selected based upon the operating mode of the process tool 102. Thus, for example, when the process tool is in a process mode, it may be producing effluent at a known rate. This rate may be known based upon experience, or may be calculated. Similarly the viscosity of the effluent may be measured by any suitable means, or may also be calculated. Once the viscosity of the effluent is known, an appropriate amount of nitrogen may be injected into the effluent stream through mixing junction 114.

When the process tool 102 is in the clean mode, nitrogen may also be injected into the effluent stream in conduit 104. In the clean mode, not only may nitrogen increase the viscosity of the effluent flowing from the process tool 102, but there may be an additional reason for injecting an inert gas such as nitrogen into the effluent stream. When the process tool is in clean mode the effluent may be highly reactive, and if not diluted, may have a detrimental effect on components and/or lubricants of the pump 108. The amount and concentration of clean mode effluent which flows through conduit 104 during a clean mode of process tool 102, may also be known or calculated. Once the amount and concentration of clean mode effluent is known, then an appropriate amount of inert gas such as nitrogen may be injected into mixing junction 114 to dilute the clean mode effluent.

The first amount of inert gas which may be required during a process mode and the second amount of inert gas which may be required during a clean mode, may be the same or different. However, rather than choosing the greater of the first amount and a second amount of inert gas and supplying that amount steadily, the system 100 of the present invention may provide enough but not more inert gas than is needed in any particular mode.

In addition to process mode and clean mode, the process tool 102 may also be in an off mode. When the process tool 102 is in an off mode, the pump 108 may not need nitrogen to assist it with pumping or to dilute clean mode effluent. It may be beneficial, however, to flow a sufficient amount of nitrogen into the conduit 104 during times when the process tool 102 is in an off mode, to prevent ambient air from entering the conduit 104, due to potentially hazardous conditions which may occur when ambient air contacts any dust which may be in the conduit 104.

The controller 116 may be in communication with the process tool through signal line 118 and may at all times know what mode the process tool is in. The controller 116, knowing what mode the process tool is in, may then command the nitrogen supply to inject an appropriate amount of nitrogen into conduit 104 through mixing junction 114. Although not shown, the controller 116 may use one or more valves to modulate the amount of nitrogen which flows from the nitrogen supply 112 into the effluent stream.

Figure 2:
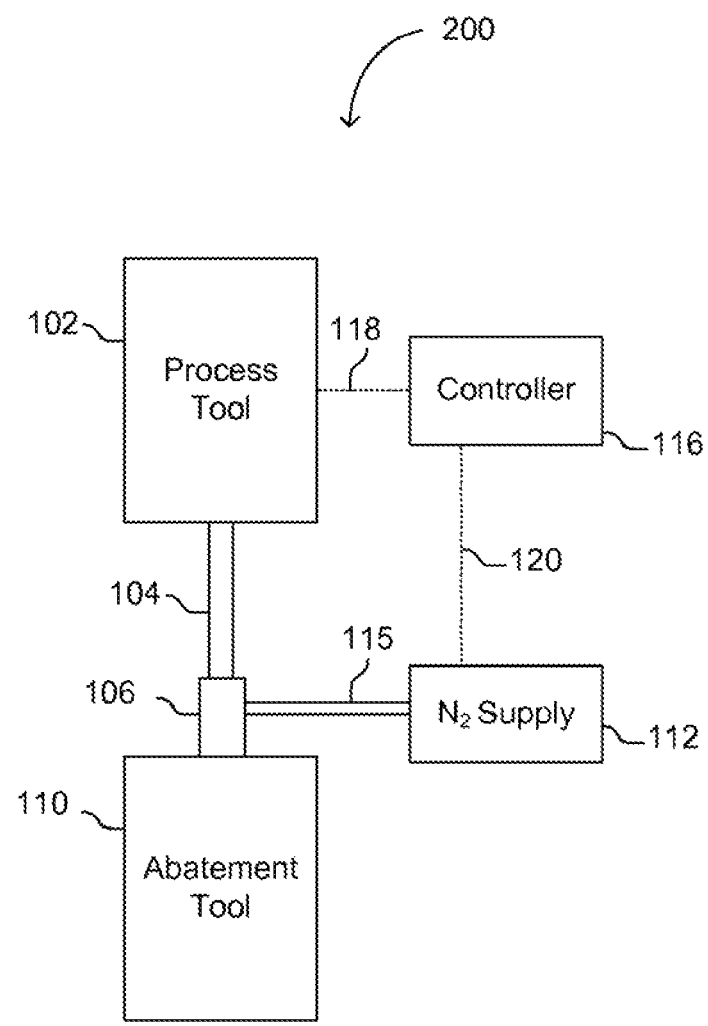
FIG. 2 is a schematic depiction of a system for reducing the use of inert gas to form an annular sheath of inert gas around an effluent gas within an abatement unit.

FIG. 2 is a schematic drawing of a system 200 of the present invention for reducing the use of inert gas. The system 200 may include a process tool 102, similar to the process tool 102 of system 100. The process tool 102 may be connected through a conduit 104 to an inlet 106 of an abatement tool 110, through which effluent from the process tool 102 may enter the abatement tool 110. The system 200 may also include inert gas supply 112 which may be connected to inlet 106 through conduit 115. A controller 116 may be connected to the process tool 102 through signal line 118 and to nitrogen supply 112 through signal line 120.

In operation, the system 200 may operate in a similar manner to the system 100 of FIG. 1. Thus, the process tool 102 may be in a process mode, a clean mode, or an off mode. When the process tool 102 is in the process mode, it may produce as a byproduct effluent which needs to be abated. The effluent may flow through conduit 104 into inlet 106. As discussed above, nitrogen may be introduced from nitrogen supply 112 through conduit 115 into inlet 106. The inlet 106 may be adapted to introduce the nitrogen into the abatement tool in the form of an annular sheath of nitrogen gas. When effluent is flowing from the process tool into the inlet 106, the inlet 106 may introduce the effluent into the abatement tool 110 in the form of an effluent gas stream which is surrounded by the annular sheath of nitrogen gas.

Prior to the present invention, the nitrogen supplied to the inlet 106 may be supplied continuously, without taking into account the mode of the process tool 102. We have discovered that, when the process tool 102 is in the clean mode, it may be beneficial to the abatement tool 110 to stop the flow of nitrogen. Stopping the flow of nitrogen during the clean mode may result in fewer particulate deposits on interior chamber walls of the abatement tool 110. Similarly, when the process tool 102 is in an off mode, the flow of nitrogen into the inlet 106 may be stopped.

The controller 116, which may be connected to the process tool 102 through signal line 118, may be aware of the mode of the process tool 102 at all times. The controller, knowing the operating mode of the process tool 102, may then command the nitrogen supply 112 to either supply nitrogen to the inlet 106 when the process tool 102 is in the process mode, or to stop the flow of nitrogen to the inlet 106 when the process tool 102 is in the clean mode or the off mode.

Figure 3:
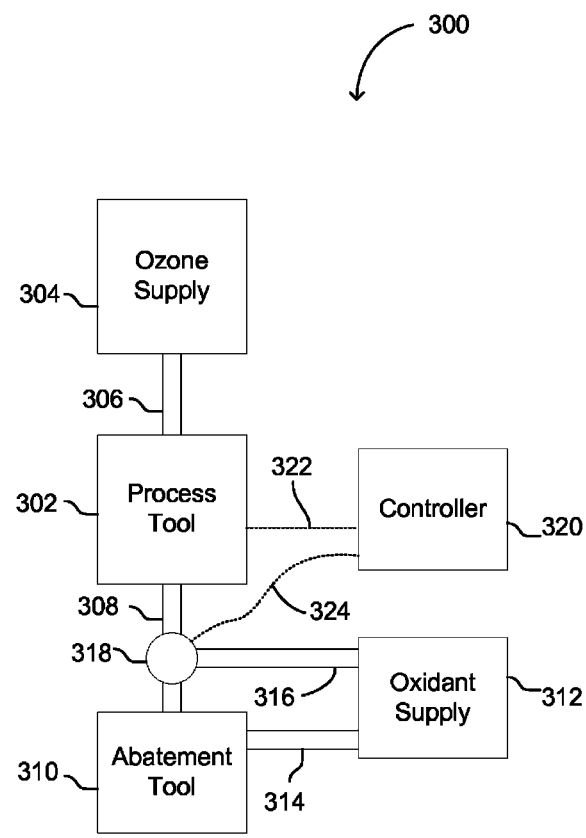
FIG. 3 is a schematic depiction of a system for using process tool effluent ozone as an oxidant in an abatement unit.

FIG. 3 is a schematic drawing of a system 300 of the present invention for reducing the use of resources. The system 300 may include a process tool 302 which uses ozone and a process. The ozone may be supplied to the process tool 302 from an ozone supply 304 connected to the process tool 302 through conduit 306. The process tool 302 may also be connected through conduit 308 to abatement tool 310, such that effluent may pass from the process tool 302 into the abatement tool 310 to be abated. Oxidant supply 312 may be connected, and supply oxidant, to the abatement tool 310 through conduit 314. The oxidant supply 312 may also be connected to the conduit 308 through conduit 316 and valve 318.

Controller 320 may be connected to the process tool 302 through signal line 322, and to the valve 318 through signal line 324.

In operation, the process tool 302 of the system 300 may operate in multiple operating modes. For example, the process tool 302 may operate in an ozone mode and in a non-ozone mode. The ozone mode may be any operation where ozone is introduced into the process tool 302 from the ozone supply 304 and in which unreacted ozone exits the process tool 302 as effluent. The non-ozone mode may be any other mode in which ozone is not being supplied to the process tool 302, and is not exiting the process tool 302 as effluent.

When the process tool 302 is operating in an ozone mode, the controller may configure valve 318 to divert the ozone which may be exiting the process tool 302 through conduit 308 into conduit 316 and then into oxidant supply 312. When ozone is diverted into the oxidant supply 312, it does not need to be abated, and may reduce the requirement for externally supplied oxidant. Conversely, when the process tool 302 is in a non-ozone mode, the controller 320 may configure valve 318 to direct any effluent from the process tool 302 into the abatement tool 310.

Figure 4:
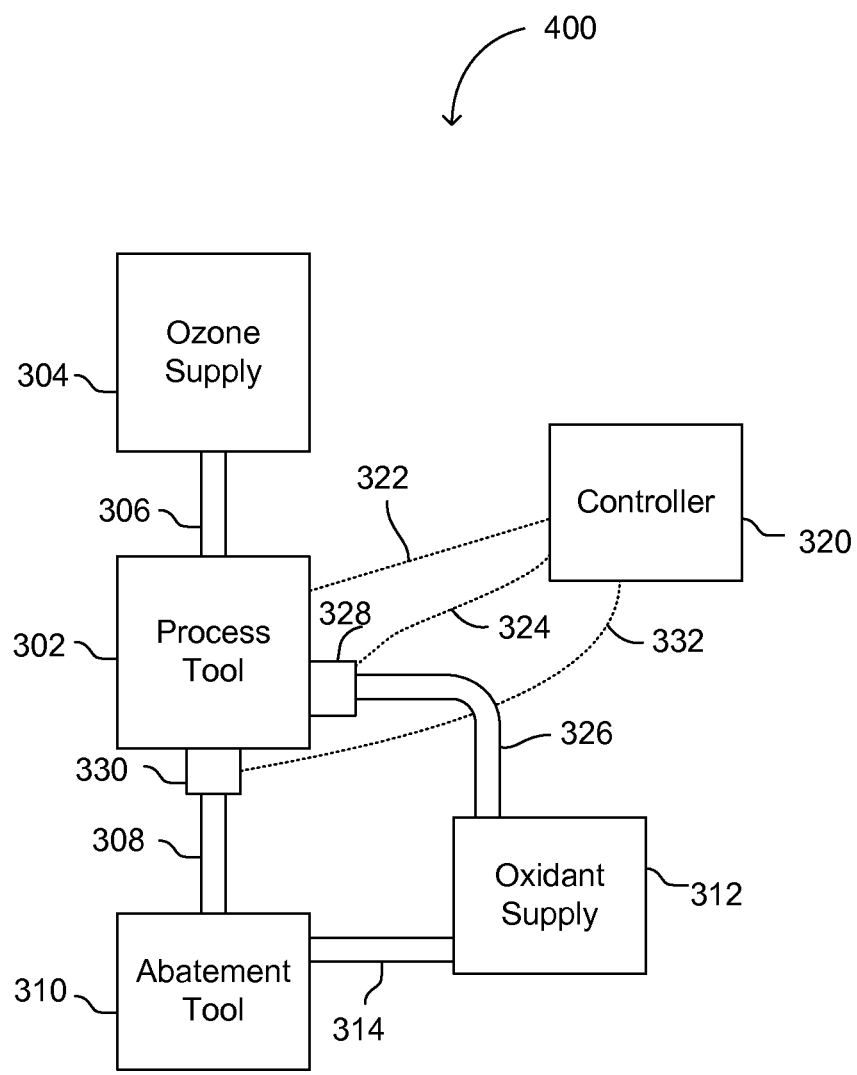
FIG. 4 is a schematic depiction of an alternate embodiment of the system of FIG. 3.

FIG. 4 is a schematic drawing of a system 400 of the present invention for reducing the use of resources. System 400 may be similar to the system 300 of FIG. 3 with the following differences. The oxidant supply 312 of system 400 is not connected to the conduit 308 through the conduit 316 and the valve 318 as it is in the system 300 of FIG. 3. Instead, the oxidant supply 312 may be connected directly to the process tool 302 through a conduit 326 and valve 328. In addition, the system 400 may include a valve 330 which may be located between conduit 308 and process tool 302, and connected to controller 320 through signal line 332.

In operation, the system 400 may operate in a manner similar to the system 300, with the following differences. In the system 400, when the process tool 302 is in the ozone mode, the controller 320 may command the valve 330 to close and the valve 328 to open, thereby diverting ozone from the process tool 302 into the oxidant supply 312. In the non-ozone mode. The controller 320 may close valve 328 and open valve 330 to divert effluent requiring abatement into the abatement tool 310.

Figure 5:
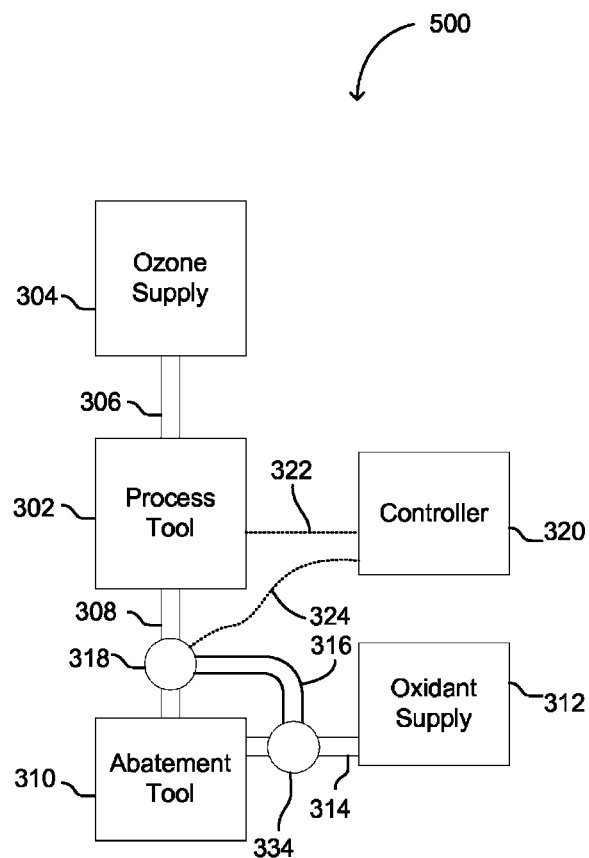
FIG. 5 is a schematic depiction of a second alternate embodiment of the system of FIG. 3.

FIG. 5 is a schematic drawing of a system 500 of the present invention for reducing the use of resources. System 500 may be similar to the system 300 of FIG. 3 with the following differences. In system 500, the oxidant supply 312 may not be adapted to receive ozone at all. Instead, the conduit 308 may be connected to the conduit 314 through valves 318, 334 and conduit 316.

In operation, the system 500 may operate in a manner similar to that of the system 300 of FIG. 3, with the following differences. In system 500, when the process tool 302 is in an ozone mode the controller 320 may command the valve 318 to divert ozone through the conduit 316 into the conduit 314 through valve 334, which may prevent back flow of oxidant from conduit 314 into conduit 316. When the process tool is in a non-ozone mode the system 500 may direct effluent requiring abatement from the process tool 302 through conduit 308 and valve 318 into the abatement tool 310.

Figure 6:
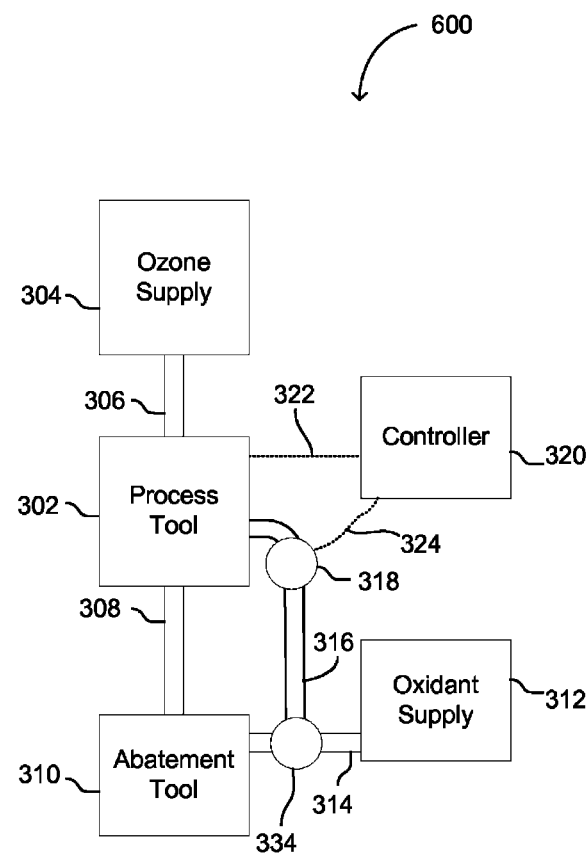
FIG. 6 is a schematic depiction of a third alternate embodiment of the system of FIG. 3.

FIG. 6 is a schematic drawing of a system 600 of the present invention for reducing the use of resources. The system 600 may be similar to the system 500 with the following differences. In the system 600, the conduit 316 connects the conduit 314 with the process tool 302 rather than connecting the conduit 314 to conduit 308 as it does in system 500.

In operation, the system 600 may operate in a manner similar to the system 500.

Figure 7:
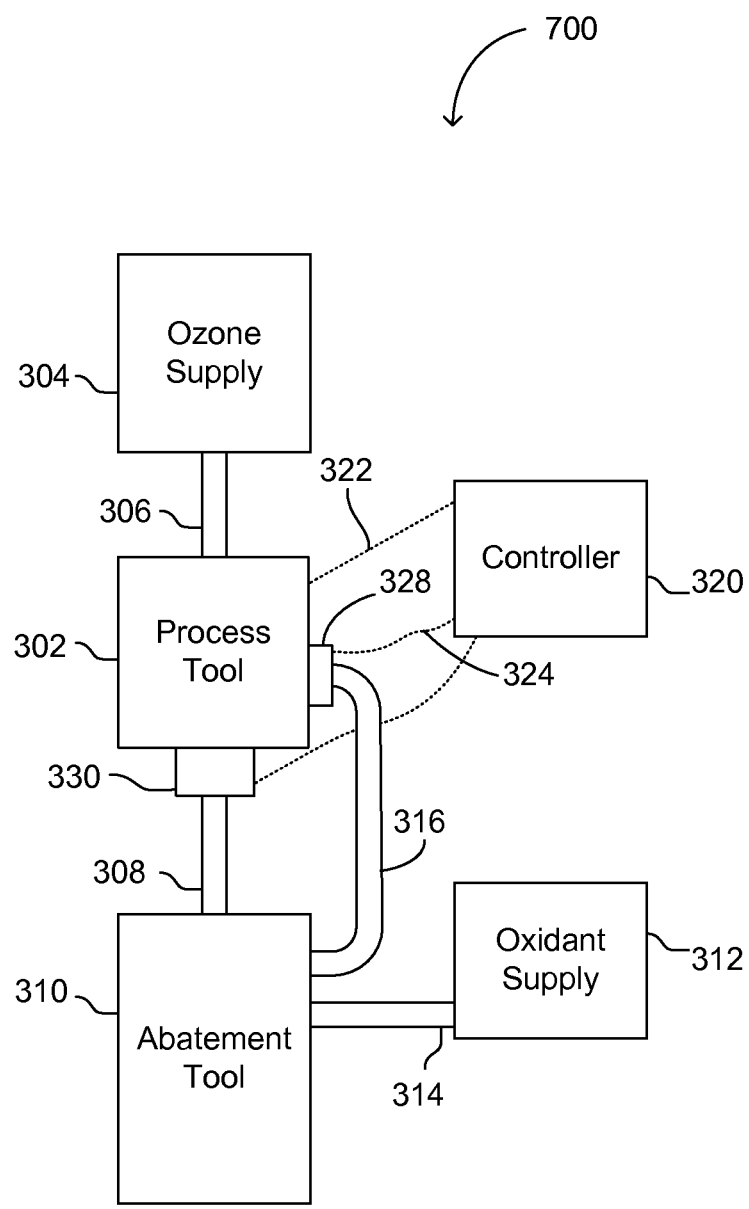
FIG. 7 is a schematic depiction of a fourth alternate embodiment of the system of FIG. 3.

FIG. 7 is a schematic drawing of a system 700 of the present invention for reducing the use of resources. The system 700 may be similar to the system 400 with the following differences. In the system 700, the conduit 316 connects the process tool through valve 328 to the abatement tool, instead of to the oxidant supply 312.

In operation, the system 700 may operate in a manner similar to the system 400.

Figure 8:
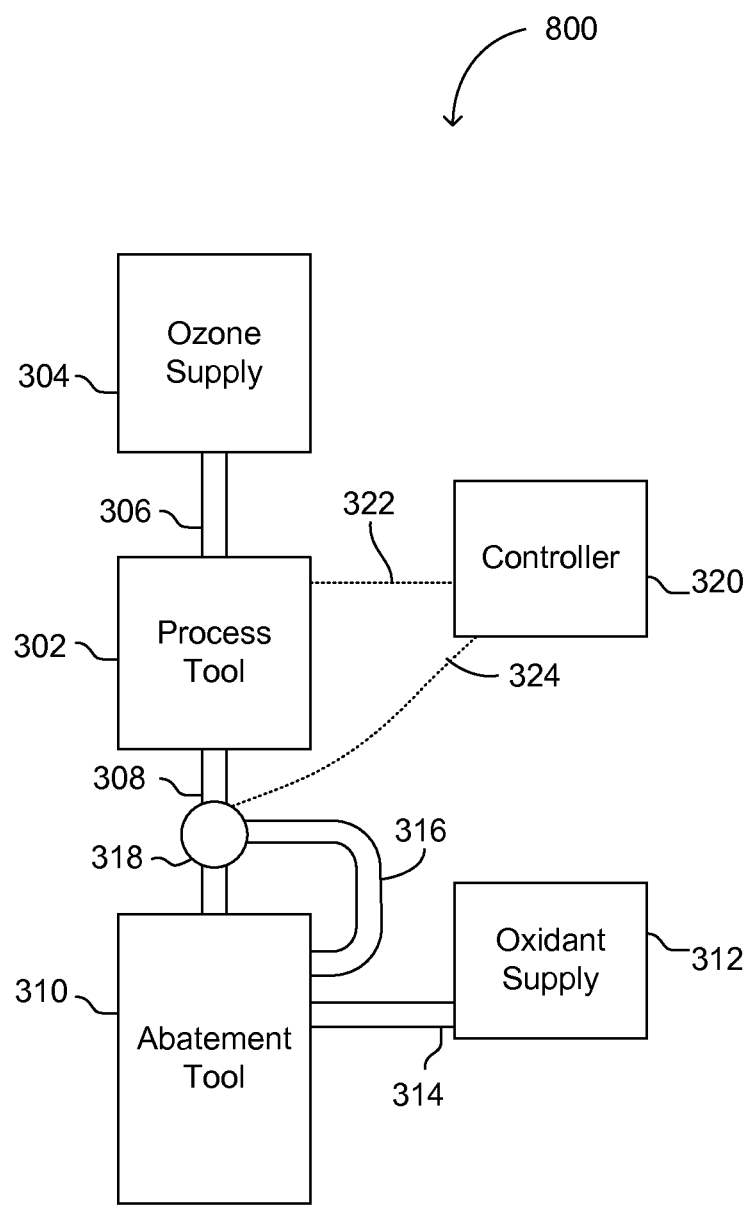
FIG. 8 is a schematic depiction of a fifth alternate embodiment of the system of FIG. 3.

FIG. 8 is a schematic drawing of a system 800 of the present invention for reducing the use of resources. The system 800 may be similar to the system 300 with the following exceptions. In the system 800, the conduit 316 connects the conduit 308 through valve 318 to the abatement tool 310 directly and not to the oxidant supply 312 as it does in the system 300.

In operation, the system 800 may operate in a manner similar to the system 300, with the following exceptions. When the process tool 302 is in an ozone mode, the controller may configure valve 318 to divert ozone through the conduit 316 into the abatement tool 310. When the process tool is in a non-ozone mode, the controller 320 may configure the valve 318 to direct effluent requiring abatement from the process tool 302 into the abatement tool 310.

Figure 9:
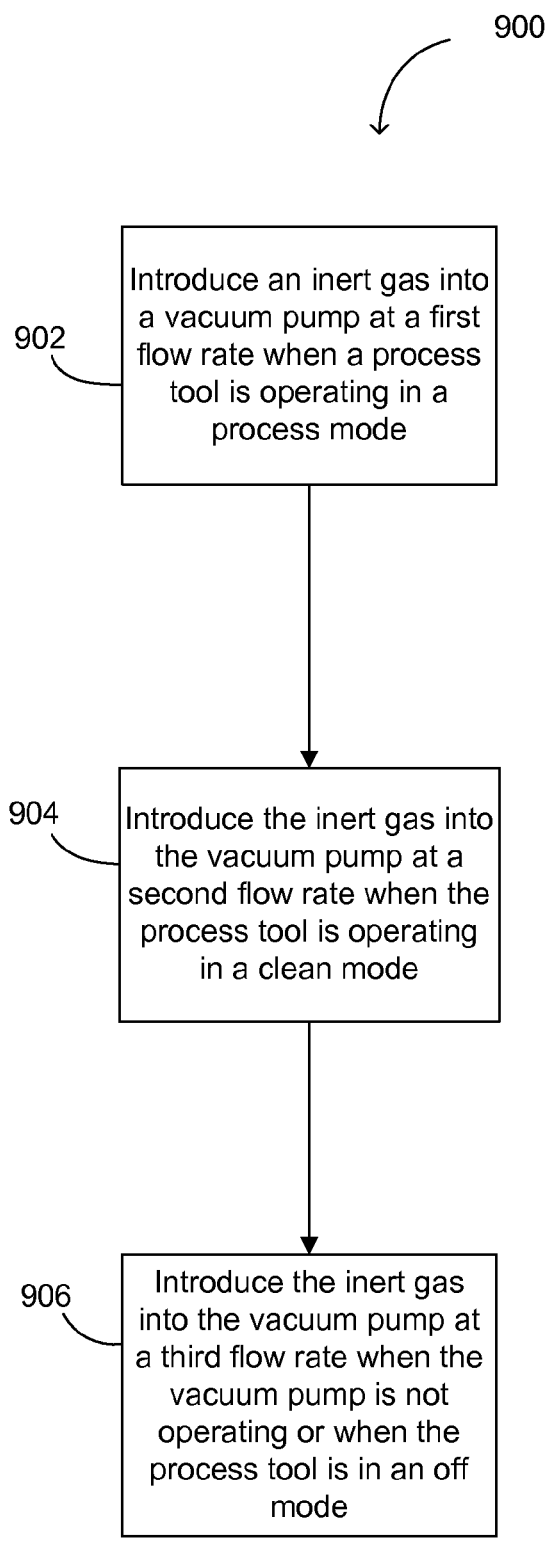
FIG. 9 is a flowchart of a method of the present invention for reducing the use of inert gases in an electronic device manufacturing system.

FIG. 9 is a flowchart of a method 900 of the present invention for reducing the use of inert gases in an electronic device manufacturing system. In step 902, inert gas, typically nitrogen, is introduced at a first flow rate into a vacuum pump which is being used to evacuate effluent from a process tool which is in the process mode. As described above, the first flow rate of inert gas may be a rate sufficient to raise the viscosity of the effluent to a predetermined viscosity. In step 904, the inert gas is introduced into the vacuum pump at a second flow rate when the process tool is operating in a clean mode. As discussed above, the second flow rate of inert gas may be a rate sufficient to dilute the clean effluent to reduce the possibility of damaging the vacuum pump and/or the vacuum pump's lubrication. Finally, in step 906, inert gas is introduced into the vacuum pump at a third flow rate when the process tool and/or the vacuum pump are in an off mode. As discussed above, the third flow rate may be a flow rate which is sufficient to prevent ambient air from entering the abatement system.

Figure 10:
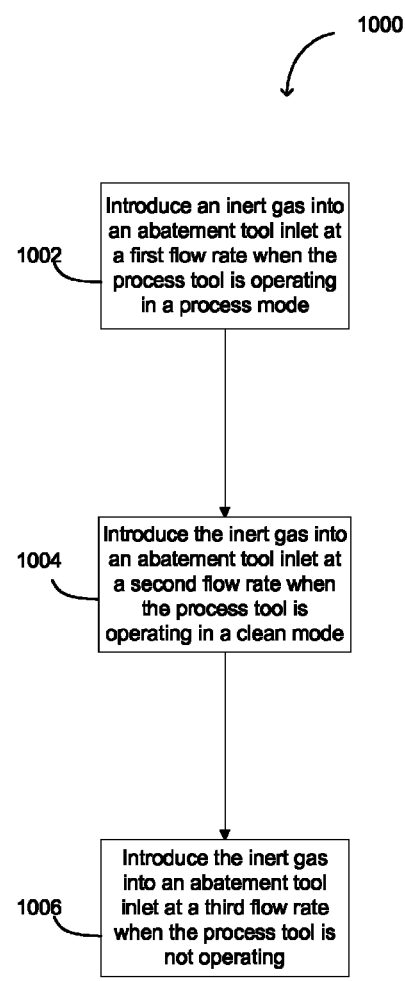
FIG. 10 is a flowchart of a method of the present invention for reducing the use of inert gases in an electronic device manufacturing system.

FIG. 10 is a flowchart of another method 1000 of the present invention for reducing the use of inert gases in an electronic device manufacturing system. In step 1002 inert gas is introduced into an abatement tool in let at a first flow rate when the process tool is operating in a process mode. The first flow rate may be a flow rate sufficient to prevent some particulate matter from adhering to an interior wall of the abatement unit. As described above, the inert gas may enter the abatement unit in the shape of annular sheath through which particulate matter may have difficulty passing to reach the interior wall of the abatement unit. In step 1004 gas is introduced into an abatement tool inlet of the second flow rate when the process tool is operating in a clean mode. As described above, the second flow rate may be a zero flow rate. It has been observed that when the second flow rate is a zero flow rate, the abatement tool may experience fewer particulates adhering to the inside wall of the abatement tool. In step 1006, the inert gas is introduced into the abatement tool inlet and a third flow rate when the process tool is in an off mode. The third flow rate may be a zero flow rate.

Figure 11:
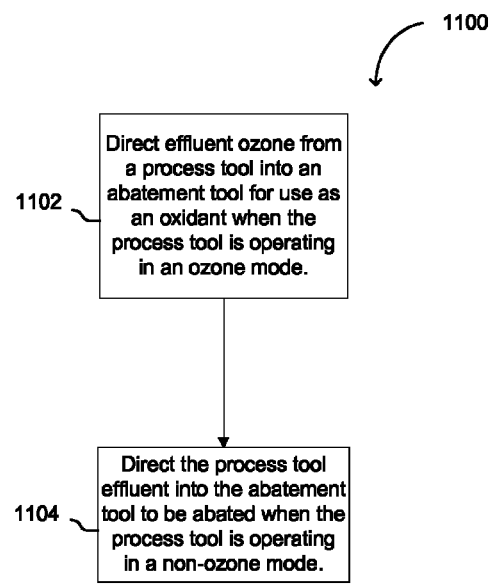
FIG. 11 is a flowchart of a method of the present invention for reducing the need for abatement and the need for oxidant for abating electronic device manufacturing system effluent.

FIG. 11 is a flowchart of a method 1100 of operating an electric device manufacturing system using process tool effluent ozone as an oxidant in an abatement tool. In step 1102, process tool effluent ozone is directed into an abatement tool for use as an oxidant when the process tool is operating in an ozone mode. In step 1104, process tool effluent is directed into the abatement unit to be abated when the process tool is operating in a non-ozone mode.

The foregoing description discloses only exemplary embodiments of the invention. Modifications of the above disclosed apparatus and methods which fall within the scope of the invention will be readily apparent to those of ordinary skill in the art. In some embodiments, the apparatus and methods of the present invention may be applied to semiconductor device processing and/or electronic device manufacturing.

Accordingly, while the present invention has been disclosed in connection with exemplary embodiments thereof, it should be understood that other embodiments may fall within the scope of the invention, as defined by the following claims.

What is claimed is:

1. An electronic device manufacturing system comprising:
   a process tool;
   an ozone supply coupled to the process tool via a first conduit and adapted to supply ozone to the process tool;
   an abatement tool adapted to receive effluent from the process tool; and
   a second conduit connecting the abatement tool to the process tool, wherein the second conduit comprises a first valve that is adapted to:
     direct unreacted ozone that exits the process tool into a third conduit for use in the abatement tool as an oxidant; and
     direct effluent that exits the process tool into the abatement tool via the second conduit.

2. The electronic device manufacturing system of claim 1 further comprising an oxidant supply coupled to the third conduit and coupled to the abatement tool via a fourth conduit.

3. The electronic device manufacturing system of claim 2 further comprising a controller configured to operate the first valve in the second conduit to direct the unreacted ozone into the oxidant supply.

4. The electronic device manufacturing system of claim 1 wherein the third conduit directs the unreacted ozone into a fifth conduit that is coupled to the abatement tool.

5. The electronic device manufacturing system of claim 1 wherein the third conduit is coupled to the abatement tool and directs the unreacted ozone into the abatement tool for use as an oxidant.

6. The electronic device manufacturing system of claim 1 further comprising a controller configured to direct the unreacted ozone that exits the process tool into the abatement tool as an oxidant when the process tool operates in an ozone mode.

7. The electronic device manufacturing system of claim 1 further comprising a controller configured to direct effluent that exits the process tool through the second conduit and into the abatement tool to be abated when the process tool operates in a non-ozone mode.

8. The electronic device manufacturing system of claim 1 wherein the process tool operates in an ozone mode and a non-ozone mode.

9. The electronic device manufacturing system of claim 4 wherein the fifth conduit is coupled between the abatement tool and an oxidant supply, the fifth conduit comprising a second valve configured to direct the unreacted ozone from the third conduit into the abatement unit.

10. The electronic device manufacturing system of claim 5 further comprising an oxidant supply coupled to the abatement tool via a sixth conduit.

11. An electronic device manufacturing system comprising:
- a process tool;
- an ozone supply coupled to the process tool via a first conduit and adapted to supply ozone to the process tool;
- an abatement tool adapted to receive effluent from the process tool;
- a second conduit connecting the abatement tool to the process tool, wherein the second conduit comprises a first valve and is adapted to direct effluent that exits the process tool into the abatement tool, the effluent to be abated; and
- a third conduit coupled to the process tool, wherein the third conduit comprises a second valve and is adapted to direct unreacted ozone that exits the process tool for use in the abatement tool as an oxidant.

12. The electronic device manufacturing system of claim 11 wherein the process tool operates in an ozone mode and a non-ozone mode.

13. The electronic device manufacturing system of claim 11 further comprising a controller configured to operate the first and second valves.

14. The electronic device manufacturing system of claim 13 wherein the controller is configured to close the first valve and open the second valve when the process tool operates in an ozone mode.

15. The electronic device manufacturing system of claim 13 wherein the controller is configured to open the first valve and close the second valve when the process tool operates in a non-ozone mode.

16. The electronic device manufacturing system of claim 11 further comprising an oxidant supply coupled to the third conduit and to the abatement tool via a fourth conduit.

17. The electronic device manufacturing system of claim 11 wherein the third conduit directs the unreacted ozone into a fifth conduit that is coupled to the abatement tool.

18. The electronic device manufacturing system of claim 17 wherein the fifth conduit is coupled between the abatement tool and an oxidant supply, the fifth conduit comprising a third valve configured to direct the unreacted ozone from the third conduit into the abatement tool.

19. The electronic device manufacturing system of claim 11 wherein the third conduit is coupled to the abatement tool and directs the unreacted ozone into the abatement tool for use as an oxidant.

20. The electronic device manufacturing system of claim 19 further comprising an oxidant supply coupled to the abatement tool via a sixth conduit.

* * * * *